United States Patent
Sung

(10) Patent No.: US 9,443,860 B1
(45) Date of Patent: Sep. 13, 2016

(54) SEMICONDUCTOR DEVICE HAVING E-FUSE AND METHOD FOR FABRICATING THE SAME

(71) Applicant: SK hynix Inc., Gyeonggi-do (KR)

(72) Inventor: Min-Chul Sung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/862,908

(22) Filed: Sep. 23, 2015

(30) Foreign Application Priority Data

Apr. 21, 2015 (KR) .......................... 10-2015-0055863

(51) Int. Cl.
*H01L 23/525* (2006.01)
*H01L 23/528* (2006.01)
*H01L 29/06* (2006.01)
*H01L 27/112* (2006.01)

(52) U.S. Cl.
CPC ....... *H01L 27/11206* (2013.01); *H01L 23/528* (2013.01); *H01L 23/5256* (2013.01); *H01L 29/0649* (2013.01)

(58) Field of Classification Search
CPC ..................... H01L 27/11206; H01L 23/5252; H01L 23/5256; H01L 23/528; H01L 23/62
See application file for complete search history.

(56) References Cited

U.S. PATENT DOCUMENTS

| 6,667,902 | B2 | 12/2003 | Peng | |
| 8,547,763 | B2 | 10/2013 | Son et al. | |
| 9,224,496 | B2* | 12/2015 | Chung | G11C 17/12 |
| 2009/0250726 | A1 | 10/2009 | Kurjanowicz | |
| 2013/0322150 | A1 | 12/2013 | Kim et al. | |
| 2014/0071779 | A1* | 3/2014 | Son | G11C 17/16 365/225.7 |
| 2014/0071780 | A1* | 3/2014 | Son | G11C 17/16 365/225.7 |
| 2014/0098591 | A1 | 4/2014 | Chen et al. | |
| 2015/0279477 | A1* | 10/2015 | Kim | H01L 27/11206 365/96 |

* cited by examiner

*Primary Examiner* — Mohsen Ahmadi
(74) *Attorney, Agent, or Firm* — IP & T Group LLP

(57) ABSTRACT

An e-fuse including a substrate including a first active region and a second active region which are spaced from each other by an isolation region, a first program gate and a second program gate which are disposed over the first active region in parallel with each other, a single select gate disposed over the second active region; a sharing doping region formed in the first active region between the first program gate and the second program gate, a first doping region and a second doping region that are formed in the second active region on both sides of the select gate, a first metal line suitable for electrically coupling the sharing doping region to the first doping region and a second metal line connected to the second doping region.

11 Claims, 17 Drawing Sheets

SEMICONDUCTOR DEVICE HAVING E-FUSE AND METHOD FOR FABRICATING THE SAME

CROSS-REFERENCE TO RELATED APPLICATIONS

The present application claims priority of Korean Patent Application No. 10-2015-0055863, filed on Apr. 21, 2015, which is incorporated herein by reference in its entirety.

BACKGROUND

1. Field

Various embodiments of the present disclosure relate to a semiconductor device, and more particularly, to a semiconductor device having an e-fuse and a method for fabricating the same.

2. Description of the Related Art

An electronic fuse (e-fuse) is used to perform repairing or storing of specific information. Since the e-fuse has an advantage of programming at a package level, it has been broadly used in a semiconductor device, for example a semiconductor memory device such as DRAM.

The e-fuse consists of a transistor and the state of the e-fuse is sensed by breaking down a gate dielectric layer of the transistor.

The e-fuse may be arranged in a matrix to form an array. For example, a unit e-fuse may include a select transistor and a program transistor, and may be disposed in a matrix arrangement to form an array. The e-fuse array includes the select transistor for programming/reading operation of the program transistor.

Because the unit e-fuse includes the program transistor and the select transistor, the total area of the e-fuse is inevitably increased.

SUMMARY

An embodiment of the present invention is directed to an e-fuse and an e-fuse array occupying reduced total space.

Another embodiment of the present invention is directed to an e-fuse and an e-fuse array capable of preventing damage to a select transistor during operation of a program transistor.

In accordance with an embodiment of the present invention, an e-fuse may include a substrate including a first active region and a second active region that are spaced from each other by an isolation region; a first program gate and a second program gate that are disposed over the first active region in parallel with each other; a single select gate disposed over the second active region; a sharing doping region formed in the first active region between the first program gate and the second program gate; a first doping region and a second doping region that are formed in the second active region on both sides of the select gate; a first metal line configured to electrically couple the sharing doping region to the first doping region; and a second metal line connected to the second doping region.

In accordance with another embodiment of the present invention, an e-fuse array may include a plurality of select word lines, a plurality of program word lines, a plurality of bit lines and a plurality of e-fuses, wherein each of the plurality of e-fuses may include: a substrate including a first active region and a second active region that are spaced from each other by an isolation region; a first program gate and a second program gate that are disposed over the first active region in parallel with each other; a single select gate disposed over the second active region; a sharing doping region formed in the first active region between the first program gate and the second program gate; a first doping region and a second doping region that are formed in the second active region on both sides of the select gate; a first metal line configured to electrically couple the sharing doping region to the first doping region; and a second metal line connected to the second doping region.

In accordance with yet another embodiment of the present invention, an e-fuse may include a first active region; a second active region extended from a center portion of the first active region; a pair of a first program gate and a second program gate that are disposed over the first active region in parallel with each other; a first dielectric layer between the first active region and the first program gate; a second dielectric layer between the first active region and the second program gate; and a single select gate spaced from the first program gate and the second program gate, and extended to cover the center portion of the first active region between the first and second program gates and to cover a part of the second active region, and wherein an operating voltage is applied to one of the first and second program gates, and the other one of the first and second program gates floats, so that one of the first dielectric layer and the second dielectric layer is selectively ruptured. The e-fuse may further includes: a first sharing doping region formed in the first active region between opposite side surfaces of the first program gate and the select gate; a second sharing doping region formed in the first active region between opposite side surfaces of the second program gate and the select gate; and a third sharing doping region formed in the second active region under a side surface of the select gate. The e-fuse may further includes: a first metal line connected to the third sharing doping region; and a second metal line connected to the select gate, wherein the first metal line and the second metal line are disposed in parallel with each other, and the first and second metal lines are in a direction crossing with the first and second program gate. The e-fuse may further includes: a first contact plug provided between the third sharing doping region and the first metal line; and a second contact plug provided in between the select gate and the second metal line. The first dielectric layer and the second dielectric layer have the same thickness, and the third dielectric layer is thicker than the first and second dielectric layers.

In accordance with still another embodiment of the present invention, an e-fuse array may include a plurality of select word lines, a plurality of program word lines, a plurality of bit lines and a plurality of e-fuses, wherein each of the plurality of e-fuses may include: a first active region; a second active region extended from a center portion of the first active region; a pair of a first program gate and a second program gate that are disposed over the first active region in parallel with each other; a first dielectric layer between the first active region and the first program gate; a second dielectric layer between the first active region and the second program gate; and a single select gate spaced from the first program gate and the second program gate, and extended to cover the center portion of the first active region between the first and second program gates and to cover a part of the second active region, wherein an operating voltage is applied to one of the first and second program gates and the other one of the first and second program gates floats so that one of the first dielectric layer and the second dielectric layer is selectively ruptured. The e-fuse array may further includes: a first sharing doping region formed in the first active region between opposite side surfaces of the first program gate and the select gate; a second sharing doping region formed in the first active region between opposite side surfaces of the second program gate and the select gate; and a third sharing doping region formed in the second active region under a side surface of the select gate. The bit lines are connected to the third sharing doping region, wherein the select word lines are connected to the select gate, wherein the program word lines are connected to the first program gate and the second program gate, respectively, and wherein the bit lines and the select word lines are disposed in parallel with each other. The e-fuse array may further include: a first contact plug provided between the third sharing doping region and the bit line; and a second contact plug provided between the select gate and the select word line. The first dielectric layer and the second dielectric layer have the same thickness, and the third dielectric layer is thicker than the first and second dielectric layers.

In accordance with still another embodiment of the present invention, a method for programming an e-fuse including a sharing doping region, a first doping region connected to the sharing doping region, a single select transistor including a second doping region connected to a bit line and a select gate, a first program transistor and a second program transistor that share the sharing doping region and include a first gate dielectric layer and a second gate dielectric layer, respectively, wherein during a first operating voltage and a second operating voltage are applied to the select gate and the bit line, respectively, a third operating voltage is simultaneously applied to a gate of the first program transistor and a gate of the second program transistor so that the first dielectric layer and the second dielectric layer are simultaneously ruptured.

In accordance with still another embodiment of the present invention, a method for programming an e-fuse including a first program gate, a first dielectric layer under the first program gate, a second program gate, a second dielectric layer under the second program gate, a single select gate disposed between the first program gate and the second program gate, a first sharing doping region between the first program and the select gate, a second sharing doping region between the second program gate and the select gate, a third sharing doping region disposed over one side surface of the select gate, a bit line connected to the third sharing doping region and a select word line connected to the select gate, wherein while a first operating voltage and a second operating voltage are applied to the select gate and the bit line, respectively, a third operating voltage is selectively applied to one of the first and second program gates so that one of the first dielectric layer and the second dielectric layer, which is under the program gate, to which the third operating voltage is applied, is ruptured.

DETAILED DESCRIPTION

Figure 1:
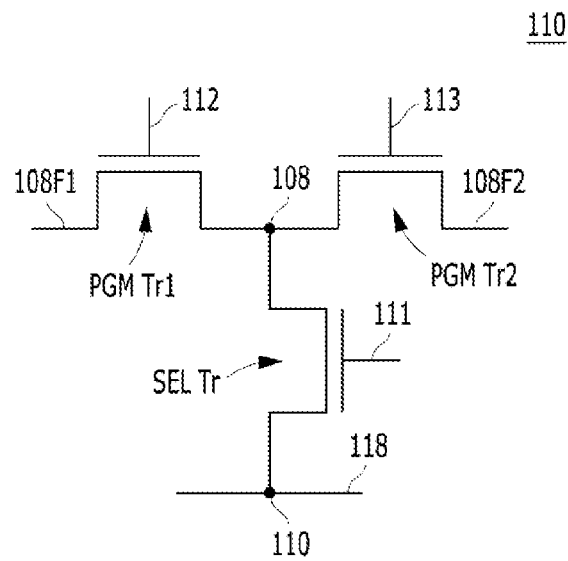
FIG. 1 is a circuit diagram illustrating an e-fuse in accordance with a first embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In order to reduce the stress applied to a select transistor during rupture of a program transistor in an e-fuse, an active region of the program transistor and an active region of the select transistor may be isolated and connected by a metal contact and a metal line to increase interconnection resistivity. However, in this case, additional space for connecting the active regions with the contact and the metal line is required so that the total area of the fuse array is increased. In accordance with exemplary embodiments of the present invention, total area of the fuse array may be reduced and the stress applied to the select transistor may be reduced. In accordance with exemplary embodiments of the present invention, the select transistors may be merged into a single select transistor and then shared by the program transistors, so that the total area of the fuse array may be decreased and the stress applied to the select transistor may be reduced.

Although a method for merging two select transistors into a single select transistor is exemplarily disclosed, a number of the select transistors to be merged or a number of the program transistors sharing the merged single select transistor may be varied according to electrical properties.

Figure 2A:
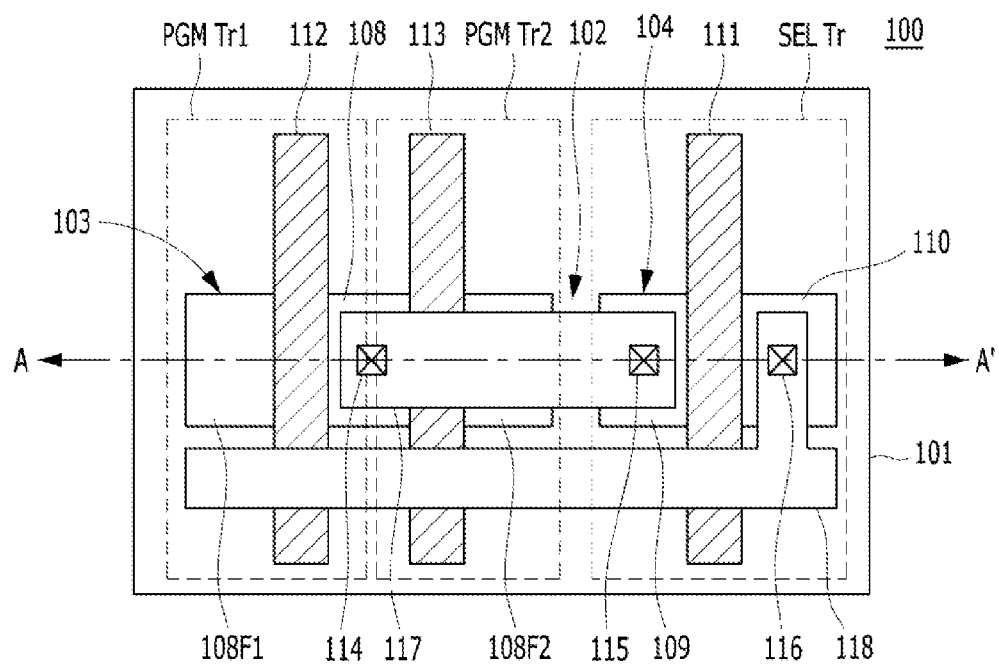
FIG. 2A is a plan view illustrating an e-fuse in accordance with the first embodiment.
Figure 2B:
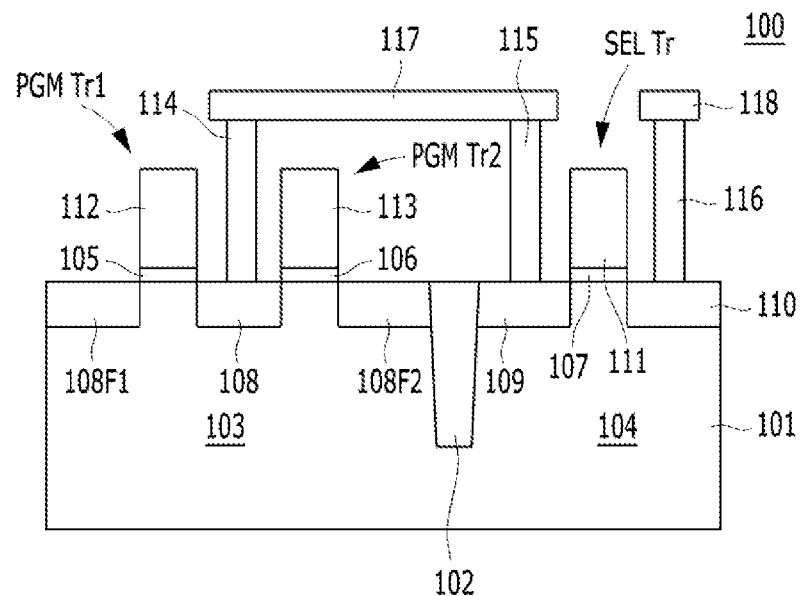
FIG. 2B is a cross-sectional view taken along the line A-A' of FIG. 2A.

FIG. 1 is a circuit diagram illustrating an e-fuse in accordance with a first embodiment. FIG. 2A is a plan view illustrating the e-fuse in accordance with the first embodiment. FIG. 2B is cross-sectional view taken along the line A-A' of FIG. 1.

Referring to FIG. 1, FIG. 2A and FIG. 2B, an e-fuse 100 may include a select gate 111, a first program gate 112, and a second program gate 113.

The select gate 111, the first program gate 112, and the second program gate 113 may be formed over a substrate 101, respectively. The substrate 101 may include a semiconductor substrate. The substrate 101 may be formed of a silicon-containing material. The substrate 101 may include one or more of silicon, monocrystalline silicon, polysilicon, amorphous silicon, silicon germanium, monocrystalline silicon germanium, polycrystalline silicon germanium, carbon-doped silicon, a combination thereof, and a multi-layer thereof. The substrate 101 may include another semiconductor material such as germanium. The substrate 101 may include a III-V group semiconductor, for example, a compound semiconductor substrate such as GaAs. The substrate 101 may include a silicon-on-insulator (SOI) substrate.

An isolation region 102 may be formed in the substrate 101, and a first active region 103 and a second active region 104 may be defined by the isolation region 102. The first active region 103 and the second active region 104 may be an island shape. The isolation region 102 may be a shallow trench isolation (STI) region which is formed by trench etching. The isolation region 102 may be formed by filling a dielectric material in isolation trenches (not numbered). The isolation region 102 may include one or more of silicon oxide, silicon nitride and a combination thereof. A first program gate 112 and a second program gate 113 may be formed on the first active region 103. The select gate 111 may be formed on the second active region 104. The first program gate 112 and the second program gate 113 may across the first active region 103. The select gate 111 may across the second active region 104. The select gate 111, the first program gate 112, and the second program gate 113 may be parallel to one another. The first program gate 112, the second program gate 113 and the select gate 111 may include a conductive material. For example, the first program gate 112, the second program gate 113 and the select gate 111 may include one or more of polysilicon, a metal and a combination thereof.

A first dielectric layer 105 may be formed between the first active region 103 and the first program gate 112. A second dielectric layer 106 may be formed between the first active region 103 and the second program gate 113. A third dielectric layer 107 may be formed between the second active region 104 and the select gate 111. The first dielectric layer 105, the second dielectric layer 106 and the third dielectric layer 107 may include one or more of silicon oxide, silicon nitride, silicon oxynitride, a high-k material, and a combination thereof, respectively. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30. The high-k material may include one or more metallic elements. The high-k material may include a hafnium-containing material. The hafnium-containing material may include one or more of hafnium oxide, hafnium silicon oxide, hafnium silicon oxynitride, and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. Also, other high-k materials known in the art may be selectively used. The first dielectric layer 105 and the second dielectric layer 106 may be formed in a thin thickness so as to facilitate the rupture.

A sharing doping region 108 may be formed in the first active region 103 between opposite side surfaces of the first program gate 112 and the second program gate 113. A first doping region 109 may be formed in the second active region 104 under one side surface of the select gate 111. A second doping region 110 may be formed in the second active region 104 under the other side surface of the select gate 111. A third doping region 108F1 may be formed in the first active region 103 under one side surface of the first program gate 112. A fourth doping region 108F2 may be formed in the first active region 103 under one side surface of the second program gate 113. The sharing doping region 108, the first doping region 109, the second doping region 110, the third doping region 108F1 and the fourth doping region 108F2 may be doped with the same conductive impurity. For example, they may be doped with an N-type impurity such as phosphorus (P) or arsenic (As). In another example, the sharing doping region 108, the first doping region 109, the second doping region 110, the third doping region 108F1 and the fourth doping region 108F2 may include a low concentration doping part and a high concentration doping part. The low concentration doping part may be referred to as a LDD structure.

A first contact plug 114 may be formed on the sharing doping region 108. A second contact plug 115 may be formed on the first doping region 109. A third contact plug 116 may be formed on the second doping region 110. The first contact plug 114, the second contact plug 115 and the third contact plug 116 may be at the same level. A first metal line 117 for electrically coupling the first contact plug 114 to the second contact plug 115 may be formed. A second metal line 118 may be formed on the third contact plug 116. The first metal line 117 and the second metal line 118 may be at the same level and may be independently formed. By the first contact plug 114, the second contact plug 115 and the first metal line 117, the sharing doping region 108 and the first doping region 109 may be connected to each other. The third doping region 108F1 and the fourth doping region 108F2 may float. The first contact plug 114, the second contact plug 115 and the third contact plug 116 may be formed of a metal-containing material. For example, they may be formed of tungsten. The first metal line 117 and the second metal line 118 may be formed of a metal-containing material. For example, they may be formed of one or more of aluminum, tungsten and other metal material.

The first program gate 112, the first dielectric layer 105, the sharing doping region 108 and the third doping region 108F1 may form a first program transistor PGM Tr1. The second program gate 113, the second dielectric layer 106, the sharing doping region 108 and the fourth doping region 108F2 may form a second program transistor PGM Tr2. The select gate 111, the third dielectric layer 107, the first doping region 109 and the second doping region 110 may form a select transistor SEL Tr. The first program transistor PGM Tr1, the second program transistor PGM Tr2 and the select transistor SEL Tr may be a metal oxide semiconductor field effect transistor (MOSFET). For example, the first program transistor PGM Tr1, the second program transistor PGM Tr2 and the select transistor SEL Tr may be N-channel MOSFETs. The first program transistor PGM Tr1 and the second program transistor PGM Tr2 may share the sharing doping region 108.

Figure 2C:
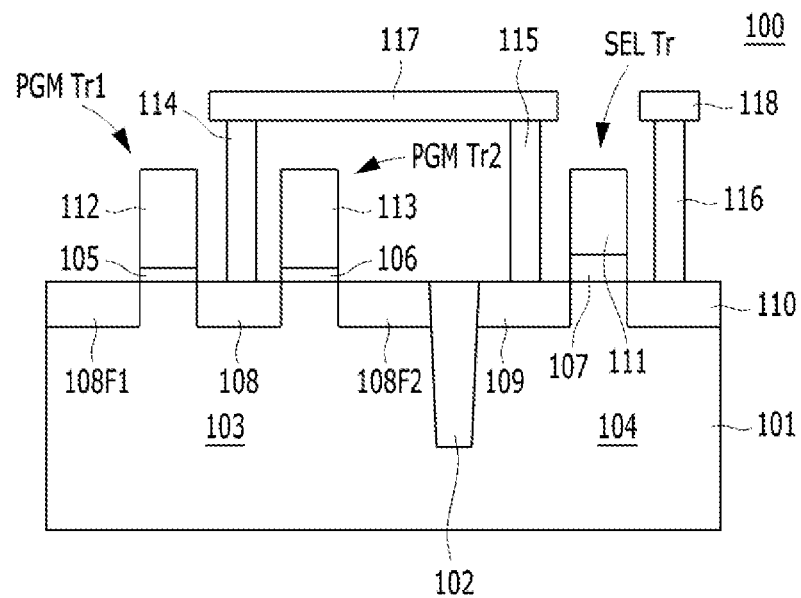
FIG. 2C is a cross-sectional view illustrating an e-fuse in accordance with a first modification of the first embodiment.

FIG. 2C is a cross-sectional view illustrating a first modification of the first embodiment. An e-fuse in accordance with the first modification may include the same elements as that of FIG. 2B except for a third dielectric layer 107.

Referring to FIG. 2C, the third dielectric layer 107 under the select gate 111 may be thicker than the first dielectric layer 105 and the second dielectric layer 106. The first dielectric layer 105 and the second dielectric layer 106 may be formed thin so as to facilitate the rupture.

Thus, as the third dielectric layer 107 forms thick, an electric field formed in the first dielectric layer 107 may decrease. As a result, it is possible to suppress a leakage current such as a gate-induced drain leakage (GIDL) current.

Figure 2D:
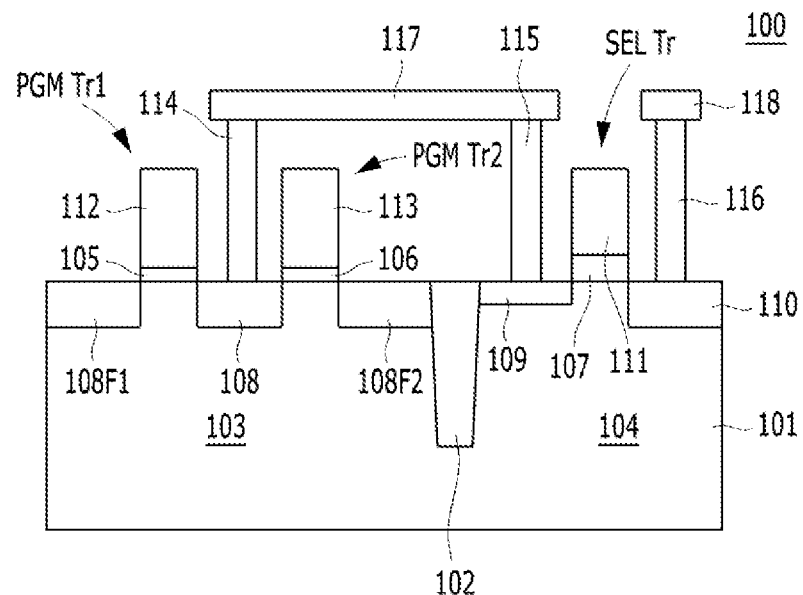
FIG. 2D is a cross-sectional view illustrating an e-fuse in accordance with a second modification of the first embodiment.

FIG. 2D is a cross-sectional view illustrating an e-fuse in accordance with a second modification of the first embodiment. An e-fuse in accordance with the second modification may include the same elements as that of FIG. 2B except for a third dielectric layer 107 and a second doping region 110.

Referring to FIG. 2D, the third dielectric layer 107 under the select gate may be thicker than the first dielectric layer 105 and the second dielectric layer 106.

The select transistor SEL Tr may have an asymmetrical junction structure in which the impurity concentration of the first doping region 109 is lower than that of the second doping region 110. That is, the first doping region 109 may be formed by doping an impurity having a low concentration while the second doping region 110 may be formed by doping an impurity having a high concentration. Therefore, even if the electrical potential of the first doping region 109 become higher than that of the select gate 111, a gate-induced drain leakage (GIDL) current may be prevented in the first doping region 109 since the first doping region 109 has the impurity with a low concentration.

As a third modification, in order to have a difference in the impurity concentration between the first doping region 109 and the second doping region 110, the first doping region 109 may be formed as the low concentration doping part by doping an impurity having a low concentration while the second doping region 110 may be formed to include the low concentration doping part and the high concentration doping part.

As the first and second modifications, it is possible to improve reliability of the select transistor by increasing the thickness of the third dielectric layer 107 under the select gate 111 or forming the first doping region 109 and the second doping region 110 in an asymmetrical junction structure.

According to the above first embodiment and modifications thereof, the first program transistor PGM Tr1 and the second program transistor PGM Tr2 may share a single select transistor SEL Tr. That is, the first program transistor PGM Tr1 and the second program transistor PGM Tr2 may share a single select transistor SEL Tr through the sharing doping region 108, the first contact plug 114, the second contact plug 115 and the first metal line 117.

Figure 3:
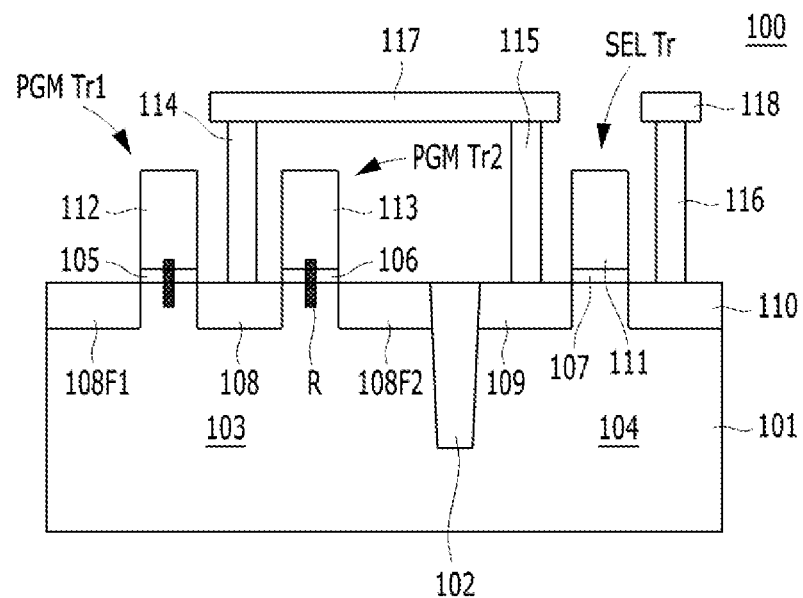
FIG. 3 is a cross-sectional view taken along the line A-A' of FIG. 1 during programming operation.

FIG. 3 is a cross-sectional view taken along the line A-A' of FIG. 1 during programming operation.

Referring to FIG. 3, during programming operation, a first to operating voltage V1 may be applied to the select gate 111, and a second operating voltage V2 may be applied to the second doping region 110 through the second metal line 118. Thus, a channel region may be formed under the select gate 111, and the second operating voltage V2 may be connected to the first doping region 109. The sharing doping region 108 shared in the first doping region 109 may become close to the second operating voltage V2.

During the above programming operation, a programming voltage, that is, a third operating voltage V3 may be simultaneously applied to the first program gate 112 and the second program gate 113. The first dielectric layer 105 between the first program gate 112 and the first active region 103 may be ruptured by the voltage difference between the first program gate 112 and the sharing doping region 108. At the same time as the rupture of the first dielectric layer 105, the second dielectric layer 106 between the second program gate 113 and the first active region 103 may be ruptured by the voltage difference between the second program gate 113 and the sharing doping region 108 (see, a reference numeral "R"). In such a manner, the e-fuse may be programmed by simultaneously rupturing the first dielectric layer 105 and second dielectric layer 106. For example, the second operating voltage V2 may be a grounded voltage, and the third operating voltage V3 may be higher than the first operating voltage V1.

Figure 4:
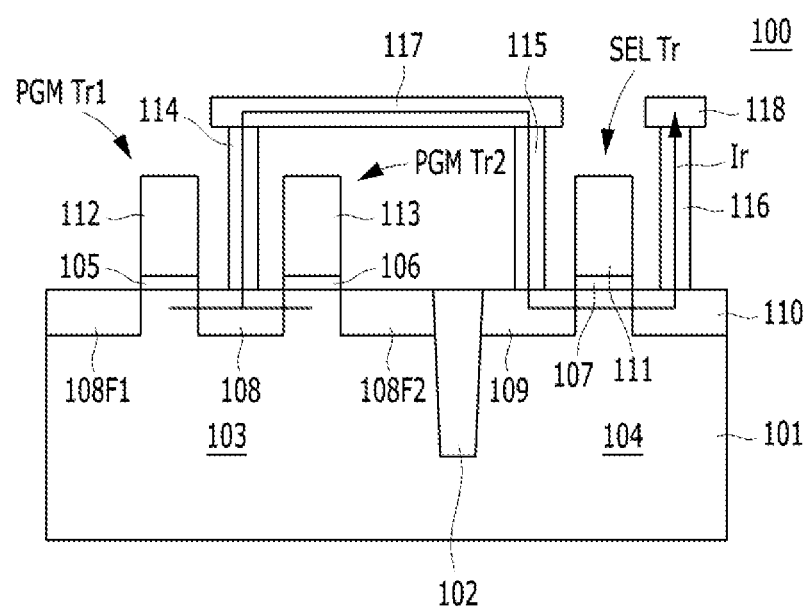
FIG. 4 is a cross-sectional view taken along the line A-A' of FIG. 1 during reading operation.

FIG. 4 is a cross-sectional view taken along the line A-A' of FIG. 1 during reading operation.

Referring to FIG. 4, a fourth operating voltage V4 may be simultaneously applied to the first program gate 112 and the second program gate 113, a fifth operating voltage V5 may be applied to the second doping region 110 through the second metal line 118, and sixth operating voltage V6 may be applied to the select gate 111. Thus, a channel region may be formed under the first program gate 112 and the second program gate 113. Therefore, a current Ir may be read through the channel region. The current Ir may flow from the sharing doping region 108 to the first doping region 109 through the first contact plug 114, the first metal line 117 and the second contact plug 115. In case that the fifth operating voltage V5 is a grounded voltage, the fourth operating voltage V4 may be the same as the sixth operating voltage V6. The third operating voltage V3 may be greater than the fourth operating voltage V4. As such, as the fourth operating voltage V4 is simultaneously applied to the first program gate 112 and the second program gate 113, it is possible to read the state of the e-fuse at the same time.

According to the above description, the first and second program transistors PGM Tr1 and PGM Tr2 may be isolated from the select transistor SEL Tr by the isolation region 102 so that the stress applied to the select transistor SEL Tr during programming operation of the first and second program transistors PGM Tr1 and PGM Tr2 may be relaxed.

Moreover, since the single select transistor SEL Tr is shared by the two first and second program transistors PGM Tr1 and PGM Tr2, the first and second program transistors PGM Tr1 and PGM Tr2 may be simultaneously programmed. Thus, two select transistors may not be required in order to drive the first and second program transistors PGM Tr1 and PGM Tr2. Therefore, the total area of the e-fuse 100 may be reduced.

Figure 5:
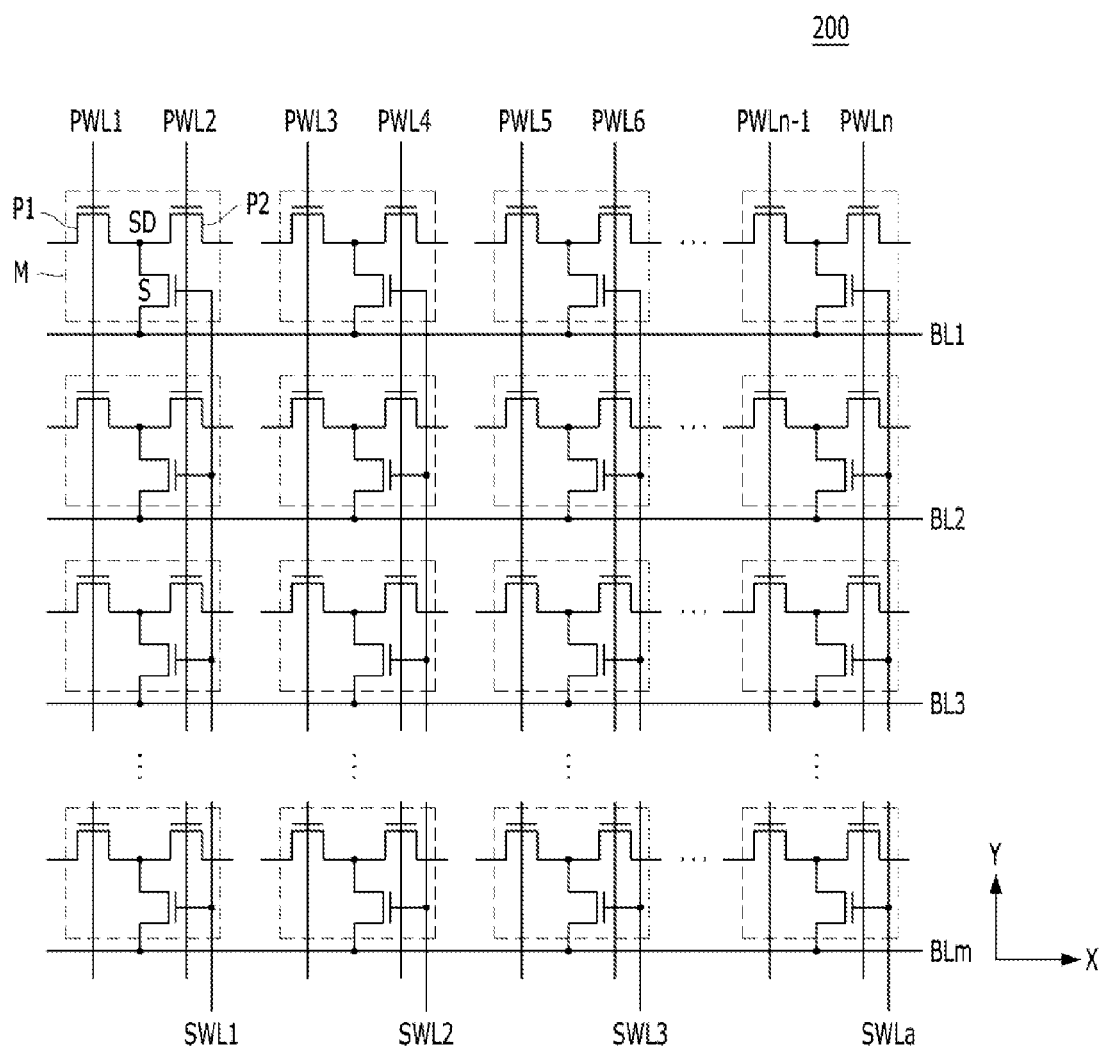
FIG. 5 is a view illustrating an e-fuse array in accordance with the first embodiment.

FIG. 5 is a view illustrating an e-fuse array including the e-fuse in accordance with the first embodiment.

Referring to FIG. 5, an e-fuse array 200 may include a plurality of select word lines SWL1 to SWLa, a plurality of program word lines PWL1 to PWLn, a plurality of bit lines BL1 to BLm and a plurality of unit e-fuses M. The plurality of unit e-fuses M may be arranged in a n×m (n and m are positive integers) matrix type and form an array. An X direction may be referred to as a row direction and a Y direction may be referred to as a column direction.

Each of the plurality of unit e-fuses M may include two program transistors P1 and P2 and a single select transistor S. Each of the unit e-fuses M may have the structures described with reference to FIGS. 1 to 2D.

The plurality of select word lines SWL1 to SWLa may be disposed in parallel with each other. The plurality of select word lines SWL1 to SWLa may extend in the column direction (Y direction). The plurality of select word lines SWL1 to SWLa may be connected to each of the select gates of the unit e-fuse M1. For example, each of the select word lines SWL1 to SWLa may be connected to the select gate 111 described with reference to FIGS. 1 to 2D.

The plurality of program word lines PWL1 to PWLn may be disposed in parallel with each other. The program word lines PWL1 to PWLn may extend in the column direction (Y direction). The program word lines PW1L1 to PWLn may be connected each of the program gates of the unit e-fuses M. For example, each of the program word line PW1L1 and the program word line PWL2 may be connected to the first program gate 112 and the second program gate 113 described with reference to FIGS. 1 to 2D, respectively.

The plurality of bit lines BL1 to BLm may be disposed in parallel with each other. The plurality of bit lines may extend in the row direction (X direction). The bit lines BL1 to BLm may be connected to any one doping region of each of the unit e-fuses M. For example, the bit lines BL1 to BLm may be connected to the second doping region 110 described with reference to FIGS. 1 to 2D. The second metal line 118 of FIGS. 1 to 2D may correspond to the bit lines BL to BLm.

As shown in FIG. 5, in each of the unit e-fuses M in the e-fuse array 200, since the single select transistor S is shared by the two program transistors P1 and P2, two select transistors may not be required so that the total area of the e-fuse array 200 may be reduced.

Hereinafter, a method for operating the e-fuse array in accordance with the first embodiment will be described. For convenience of explanation, the e-fuse array may be exemplified as a 2×2 e-fuse.

Figure 6:
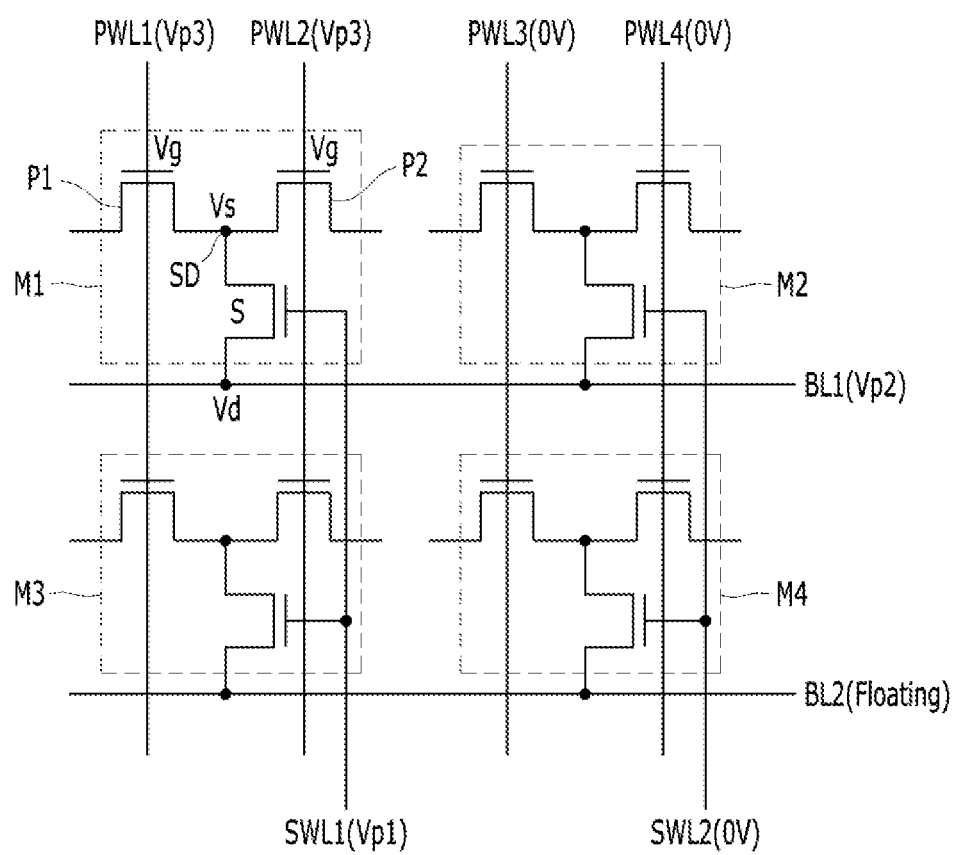
FIG. 6 is a view describing a method for programming an e-fuse array in accordance with the first embodiment.
Figure 7:
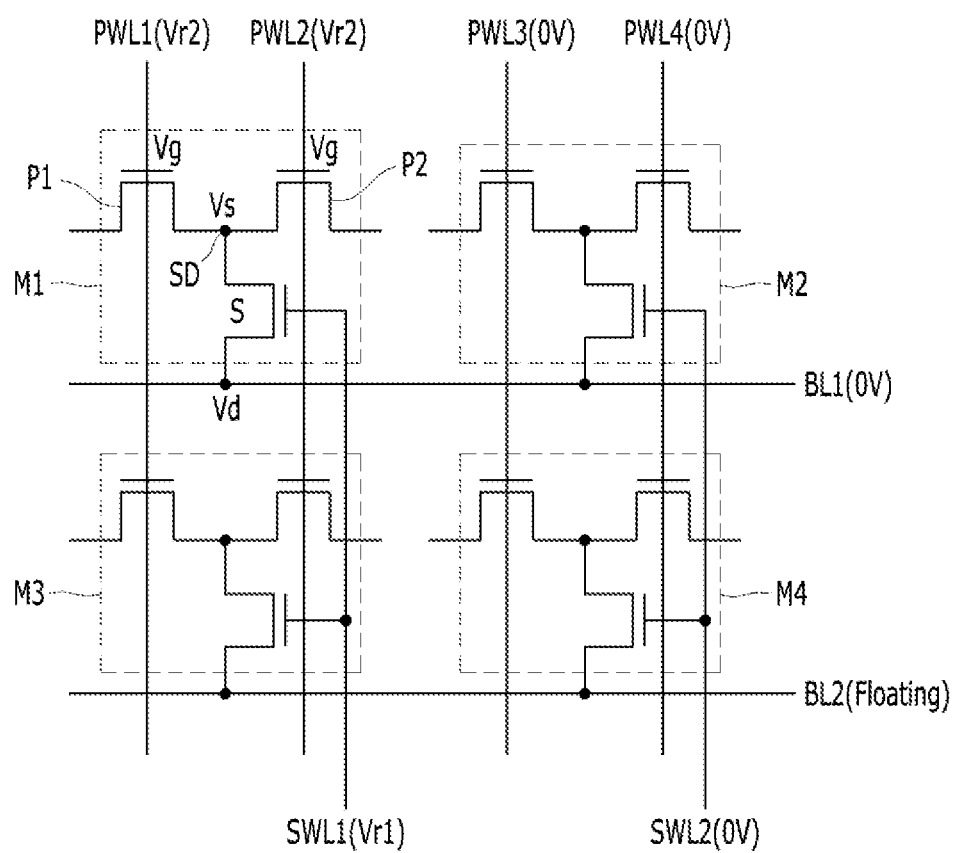
FIG. 7 is a view describing a method for reading an e-fuse array in accordance with a first embodiment.

FIG. 6 is a view for describing a method for programming the e-fuse array, and FIG. 7 is a view for describing a method for reading the e-fuse array.

Referring to FIGS. 6 and 7, the e-fuse array may include a plurality of e-fuses M1 to M4, a plurality of select word lines SWL1 and SWL2, a plurality of program word lines PWL1 to PWL4 and a plurality of bit lines BL1 and BL2.

Each of the e-fuses M1 to M4 may have the structures described with reference to FIGS. 1 to 2D.

A method for operating the e-fuse array may include a programming method and a reading method. Hereinafter, the operating method will be described with respect to, for example, an e-fuse M1.

Programming Operation

TABLE 1

| E-fuse | Vs | Vg | Vd |
|---|---|---|---|
| PGM Target | 0 V | 5.5 V | 0 V |
| Select SWL/Unselect BL | Floating | 5.5 V | Floating |
| Unselect SWL/Select BL | Floating | 0 V | 0 V |
| Unselect SWL/Unselect BL | Floating | 0 V | Floating |

Referring to Table 1 and FIG. 6, a plurality of programming voltages Vp1, Vp2 and Vp3 may be applied in order to perform the programming operation to the e-fuse M1. For example, the voltage Vp1 may be applied to the select word line SWL1 in order to select the e-fuse M1. The voltage Vp1 may be sufficient to turn on the channel of the select transistor S. The voltage Vp2 may be applied to the bit line BL1, and the voltage Vp3 may be applied to the program word lines PWL1 and PWL2. The voltage difference between the voltage Vp2 and the voltage Vp3 may be sufficient to rupture gate dielectric layers of the program transistors P1 and P2 of the selected e-fuse M1.

When programming the selected e-fuse M1, the voltage Vp1 applied to the select word line SWL1 may turn on the channel of the select transistor S. Therefore, the voltage Vp2 applied to the bit line BL1 may reach channels of the program transistors P1 and P2 through the channel of the select transistor S and the sharing doping region SD. Here, the voltage difference between the Vp3 applied to the program word lines PWL1 and PWL2 and the Vp2 applied to the bit line BL1 may result in rupture of the gate dielectric layers of the program transistors P1 and P2. Thus, the selected e-fuse M1 may be programmed.

For example, the voltage Vp1 applied to the select word line SWL1 may be 3V, the voltage Vp2 applied to the bit line BL1, and the voltage Vp3 applied to the program word lines PWL1 and PWL2 may be 5.5V.

By simultaneously applying the same level of the voltage Vp3 to the program word lines PWL1 and PWL2, it is possible to simultaneously rupture the gate dielectric layers of the program transistors P1 and P2 in the selected e-fuse M1.

When performing the programming operation to the selected e-fuse M1, the unselected e-fuse M3 also may be shared by the select word line SWL1, and the program word lines PWL1 and PWL2. However, the bit line BL2 connected to the unselected e-fuse M3 may float, and thus the programming of the unselected e-fuse M3 may be suppressed.

When performing the programming operation to the selected e-fuse M1, the unselected e-fuse M2 may also be shared by the bit line BL1. The voltage Vp2 may be applied to the bit line BL1 connected to the unselected e-fuse M2. However, the voltages applied to the select word line SWL2 and the program word lines PWL3 and PWL4 are grounded voltages (DV), and thus the select transistor S of the unselected e-fuse M2 may be in a turn-off state. Therefore, gate dielectric layers of the program transistors of the unselected e-fuse M2 may not be ruptured. That is, the unselected e-fuse M2 may not be programmed.

When performing the programming operation to the selected e-fuse M1, the bit line BL2 connected to the unselected e-fuse M4 is in a floating state and the voltages applied to the select word line SWL2 and the program word lines PWL3 and PWL4 are grounded voltages (DV), and thus the select transistor of the unselected e-fuse M4 may be in a turn-off state. Therefore, gate dielectric layers of the program transistors of the unselected e-fuse M4 may not be ruptured. That is, the unselected e-fuse M4 may not be programmed.

Reading Operation

TABLE 2

| E-fuse | Vs | Vg | Vd (BL) |
|---|---|---|---|
| Read target | 0 | 2.5 V | 2.5 V |
| Select WL/Unselect BL (in case of rupture) | 1.55 | 2.5 V | 2.5 V |
| Unselect WL/Select BL (in case of rupture) | Floating | 0 V | 2.5 V |
| Unselect WL/Unselect BL | Floating | 0 V | Floating |

Referring to Table 2 and FIG. 7, the reading operation will be described.

In order to perform the reading operation to the e-fuse M1, a plurality of reading voltages may be applied. For example, in order to select the e-fuse M1, a voltage Vr1 may be applied to the select word line SWL1 connected to the e-fuse M1. A voltage Vr2 may be applied to the program word lines PWL1 and PWL2 of the e-fuse M1, a voltage of 0V may be applied to the bit line BL1 connected to the e-fuse M1. The unselected bit line BL2 may float. The voltage Vr1 may be sufficient to turn on the channel of the select transistor S. The information stored in the e-fuse M1 may be determined by detecting an electrical current flowing to the bit line BL1 through the channel of the select transistor S and the sharing doping region SD.

For example, the voltage Vr2 may be 2.5V, and the voltage Vr1 may be 1.55V. When the program transistors P1 and P2 are ruptured, gates of the program transistors P1 and P2, the sharing doping region SD and a drain of the select transistor S may be shorted so that the voltage of 2.5V may be applied to the bit line BL1.

FIGS. 8A to 8F are views illustrating a method for fabricating the e-fuse in accordance with the first embodiment.

Figure 8A:
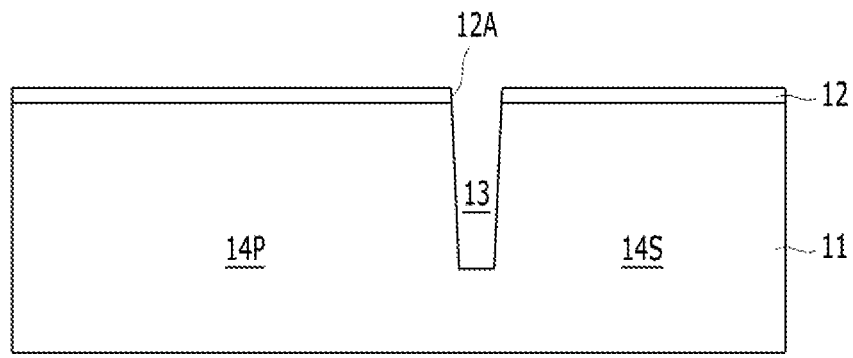
FIGS. 8A to 8F are views illustrating a method for fabricating an e-fuse in accordance with the first embodiment.

As shown in FIG. 8A, a substrate 11 may be prepared. The substrate 11 may include a material suitable for a semiconductor processing. The substrate 11 may include a semiconductor substrate. The substrate 11 may be formed of a silicon-containing material. The substrate 11 may include one or more of silicon, monocrystalline silicon, polysilicon, amorphous silicon, silicon germanium, monocrystalline silicon germanium, polycrystalline silicon germanium, carbon-doped silicon, a combination thereof, and a multi-layer thereof. The substrate 11 may include another semiconductor material such as germanium. The substrate 11 may include III/V group semiconductor materials, for example, a compound semiconductor substrate such as GaAs. The substrate 11 may include a silicon-on-insulator (SOI) substrate.

A shallow trench isolation (STI) process may be performed with respect to the substrate 11. For example, a hard mask layer 12 may be formed on the substrate 11. A plurality of openings 12A may be formed in the hard mask layer 12. In order to form the plurality of openings 12A, the hard mask layer 12 may be etched by using a mask (not shown). The hard mask layer 12 may be formed of a material having etch selectivity with respect to the substrate 11. For example, the hard mask layer 12 may include silicon nitride. Although it is not shown, a buffer layer or a pad layer may be further formed between the hard mask layer 12 and the substrate 11. The buffer layer may be formed of silicon oxide.

An isolation trench 13 may be formed. The substrate 11 may be etched by using the hard mask layer 12 having the openings 12A as an etch mask. Thus, the isolation trench 13 may be formed. A first active region 14P and a second active region 14S may be defined in the substrate 11 by the isolation trench 13. The spaces between the first active region 14P and the second active region 14S may become the isolation trench 13. In the first active region 14P, a pair of program transistors are disposed. In the second active region 14S, a select transistor is disposed.

Figure 8B:
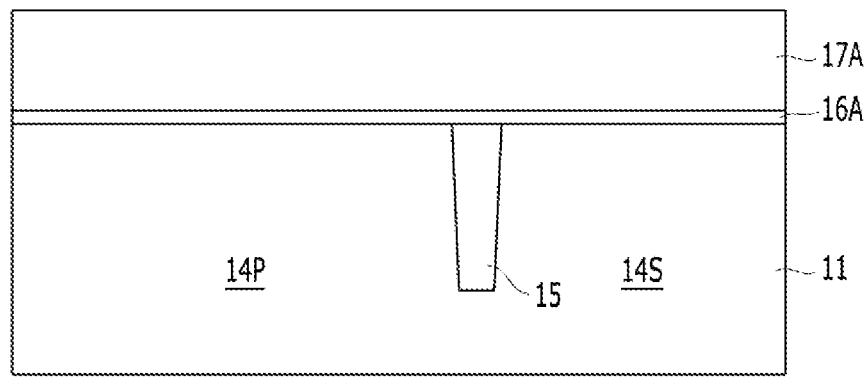

As shown in FIG. 8B, an isolation region 15 may be formed in the isolation trench 13. The isolation region 15 may include one or more of silicon oxide, silicon nitride and a combination thereof. A chemical vapor deposition (CVD) process or another deposition process may be used to fill the isolation trench 13 with a dielectric material. Subsequently, the dielectric material may be planarized by a chemical mechanical polishing (CMP) process. The isolation region 15 may include a spin-on-dielectric (SOD).

The hard mask layer 12 may be removed. A preliminary gate dielectric layer 16A may be formed on the substrate 11. The preliminary gate dielectric layer 16A may include one or more of silicon oxide, silicon nitride, silicon oxynitride, a high-k material, and a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30. The high-k material may include one or more metallic elements. The high-k material may include a hafnium-containing material. The hafnium-containing material may include one or more of hafnium oxide, hafnium silicon oxide, hafnium silicon oxynitride and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. In another embodiment, other high-k materials known in the art may be used.

A preliminary gate conductive layer 17A may be formed on the preliminary gate dielectric layer 16A. The preliminary gate conductive layer 17A may include one or more of polysilicon, a metal and a combination thereof. For example, the preliminary gate conductive layer 17A may be formed of a stack of polysilicon and a metal.

Figure 8C:
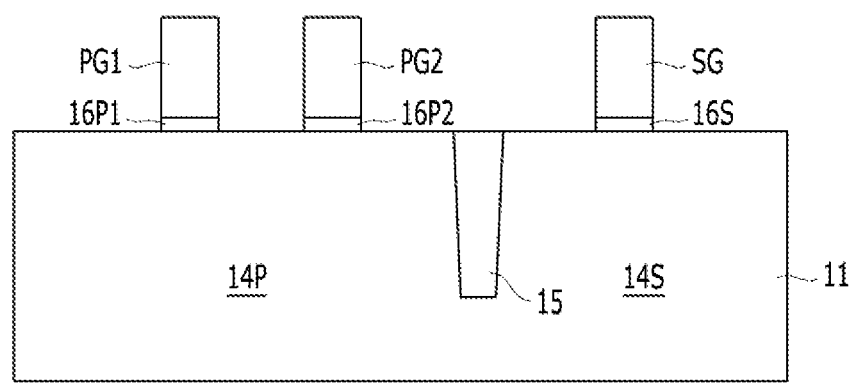

As shown in FIG. 8C, a gate patterning process may be performed. For example, the preliminary gate conductive layer 17A and the preliminary gate dielectric layer 16A may be etched. As such, a first gate dielectric layer 16P1, a second gate dielectric layer 16P2 and a third gate dielectric layer 16S may be formed. The first gate dielectric layer 16P1, the second gate dielectric layer 16P2 and the third gate dielectric layer 16S may be formed by etching the preliminary gate dielectric layer 16A. The first gate dielectric layer 16P1, the second gate dielectric layer 16P2 and the third gate dielectric layer 16S may have the same thickness. A first program gate PG1, a second program gate PG2 and a select gate SG may be formed on the first gate dielectric layer 16P1, the second gate dielectric layer 16P2 and the third gate dielectric layer 16S, respectively. The first program gate PG1, the second program gate PG2 and the select gate SG may have the same thickness. In another example, the thickness of the third gate dielectric layer 16S may be different from those of the first and second gate dielectric layers 16P1 and 16P2. For example, the third gate dielectric layer 165 may be thicker than the first and second gate dielectric layers 16P1 and 16P2. In case of increasing the thickness of the third gate dielectric layer 165, an electric field formed in the third gate dielectric layer 165 may be reduced and the occurrence of a gate-induced drain leakage (GIDL) current may be further suppressed. In order to increase the thickness of the third gate dielectric layer 16S, a preliminary gate dielectric layer for the third gate dielectric layer 165 may be further formed.

Figure 8D:
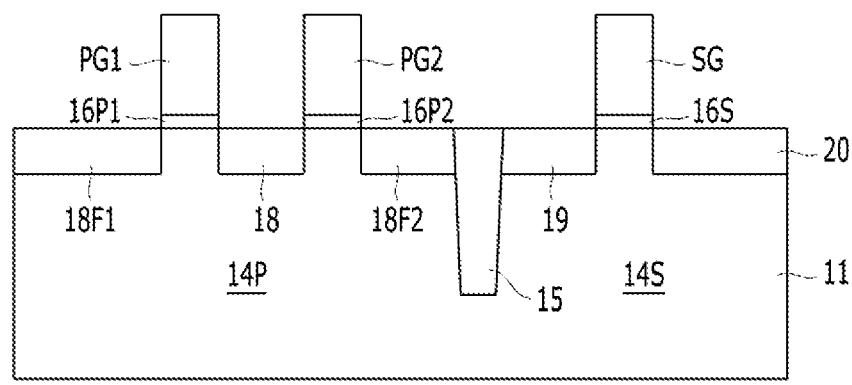

As shown in FIG. 8D, a plurality of doping regions may be formed. The plurality of doping regions may include a sharing doping region 18, a first doping region 19, a second doping region 20, a third doping region 18F1 and a fourth doping region 18F2.

The sharing doping region 18 may be formed in the first active region 14P between the opposite side surfaces of the first program gate PG1 and the second program gate PG2. The first doping region 19 may be formed in the second active region 14S under one side surface of the select gate SG. The second doping region 20 may be formed in the second active region 14S under the other side surface of the select gate SG. The third doping region 18F1 may be formed in the first active region 14P under one side surface of the first program gate PG1. The fourth doping region 18F2 may be formed in the first active region 14P under one side surface of the second program gate PG2. The sharing doping region 18, the first doping region 19, the second doping region 20, the third doping region 18F1 and the fourth doping region 18F2 may be doped with the same conductive impurities. For example, they may be doped with an N-type impurity such as phosphorus (P) or arsenic (As). In order to suppress the occurrence of a GIDL current, as shown in FIG. 2D, the impurity concentration of the first doping region 19 may be different from that of the second doping region 20.

In order to form the above doping regions, implantation or other doping technology may be performed Although not shown, gate spacers may be formed on both sidewalls of the first program gate PG1, the second program gate PG2 and the select gate SG, respectively. Thus, the sharing doping region 18, the first doping region 19, the second doping region 20, the third doping region 18F1 and the fourth doping region 18F2 may include a low concentration doping part and a high concentration doping part. The low concentration doping part may be referred to as a LDD structure.

According to the above processes, a first program transistor, a second program transistor and a select transistor may be formed. The first program transistor may include the first program gate PG1, the sharing doping region 18 and the third doping region 18F1. The second program transistor may include the second program gate PG2, the sharing doping region 18 and the fourth doping region 18F2. The select transistor may include the select gate SG, the first doping region 19 and the second doping region 20. The select transistor may be spaced from the first and second program transistors by the isolation region 15. Thus, during the programming operation, the stress applied to the select transistor may be prevented.

The first program transistor and the second program transistor may share the sharing doping region 18.

Figure 8E:
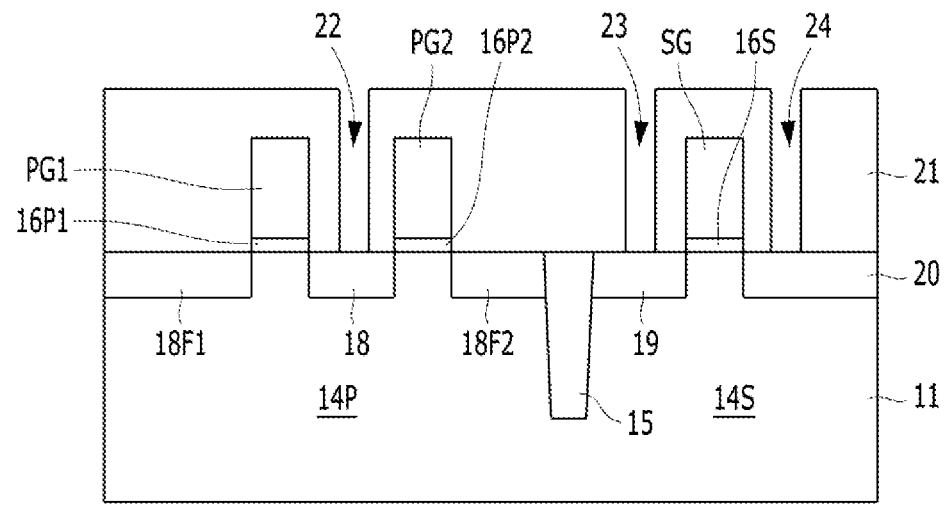

As shown in FIG. 8E, an interlayer dielectric layer 21 may be formed. The interlayer dielectric layer 21 may include one or more of silicon oxide, silicon nitride and a combination thereof.

A first contact hole 22, a second contact hole 23 and a third contact hole 24 may be formed by selectively etching the interlayer dielectric layer 21. The surface of the sharing doping region 18 may be exposed by the first contact hole 22. The surface of the first doping region 19 of the select transistor may be exposed by the second contact hole 23. A surface of the second doping region 20 of the select transistor may be exposed by the third contact hole 24.

Figure 8F:
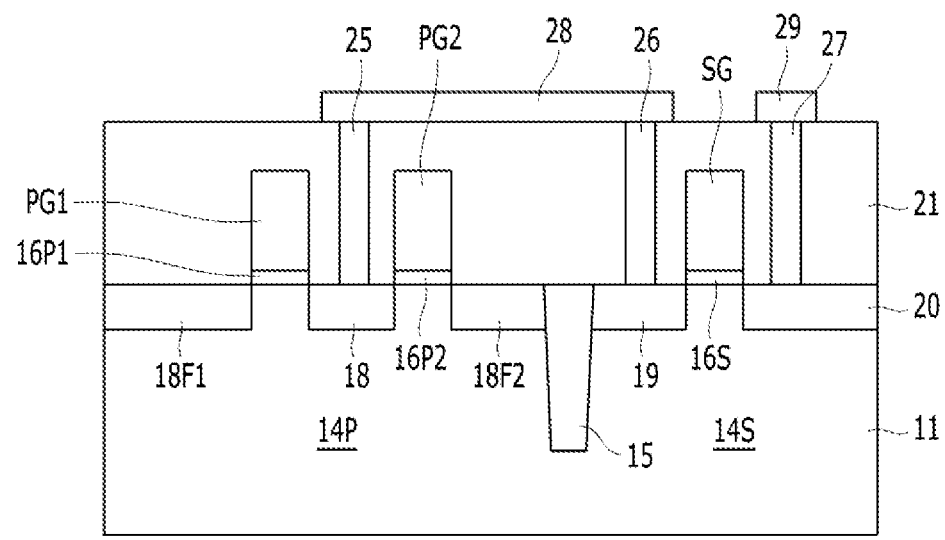

As shown in FIG. 8F, contact plugs may be formed in the first contact hole 22, the second contact hole 23 and the third contact hole 24, respectively. A first contact plug 25 may be formed in the first contact hole 22, a second contact plug 26 may be formed in the second contact hole 23. A third contact plug 27 may be formed in the third contact hole 24. The first, second and third contact plugs 25, 26 and 27 may be formed of a metal material. For example, the first, second and third contact plugs 25, 26 and 27 may include one or more of titanium, titanium nitride, tungsten, and a combination thereof. In the present embodiment, the first, second and third contact plugs 25, 26 and 27 may be a stack of titanium, titanium nitride and tungsten in sequence.

Then, a first metal line 28 and a second metal line 29 may be formed. The first contact plug 25 and the second contact plug 26 may be electrically coupled to each other by the first metal line 28. Thus, the select transistor may be shared by the first and second program transistors through the sharing doping region 18. The second metal line 29 may be electrically coupled to the third contact plug 27. The first and second metal lines 28 and 29 may be formed of a metal material. The first metal line 28 and the second metal line 29 may be at the same level. The first metal line 28 may be electrically independent of the second metal line 29.

Figure 9:
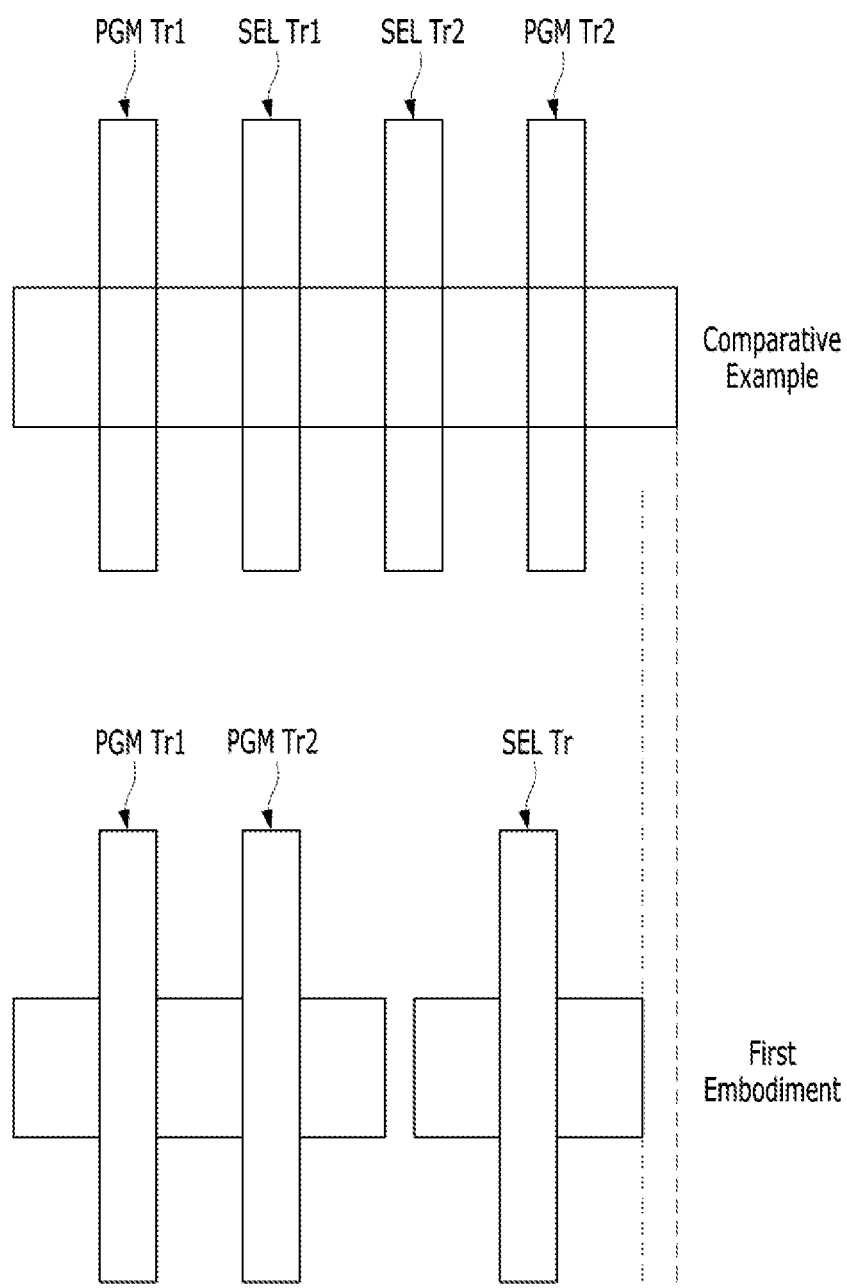
FIG. 9 is a view describing area reduction effect of an e-fuse array in accordance with the first embodiment

FIG. 9 is a view describing the area reduction effect of the e-fuse array in accordance with the first embodiment. In FIG. 9, the comparative embodiment shows a case where each select transistor is provided with respect to each program transistor in order to select a program transistor.

Referring to FIG. 9, since the only a single select gate is arranged in the e-fuse array in accordance with the first embodiment, it is possible to reduce the area in comparison with the comparative embodiment. For example, it is possible to reduce the area by about 10%.

Figure 10:
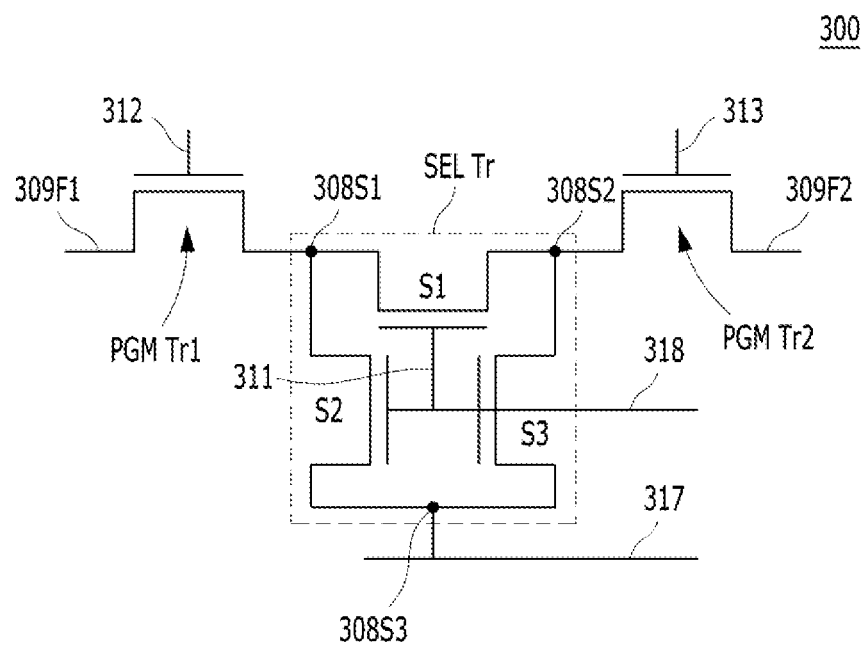
FIG. 10 is a circuit diagram illustrating an e-fuse in accordance with a second embodiment.
Figure 11A:
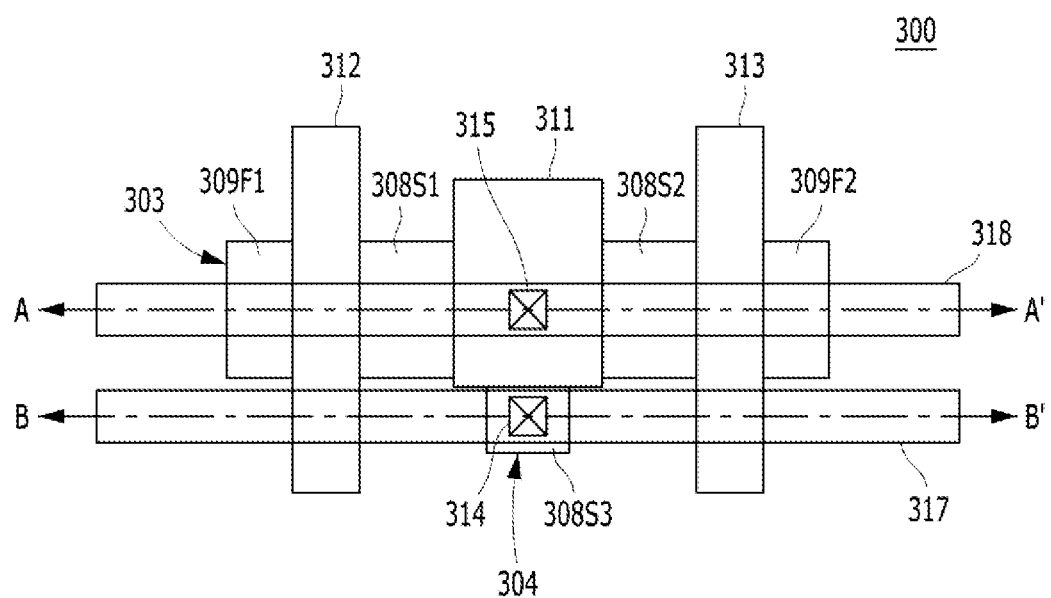
FIG. 11A is a plan view illustrating an e-fuse in accordance with the second embodiment.
Figure 11B:
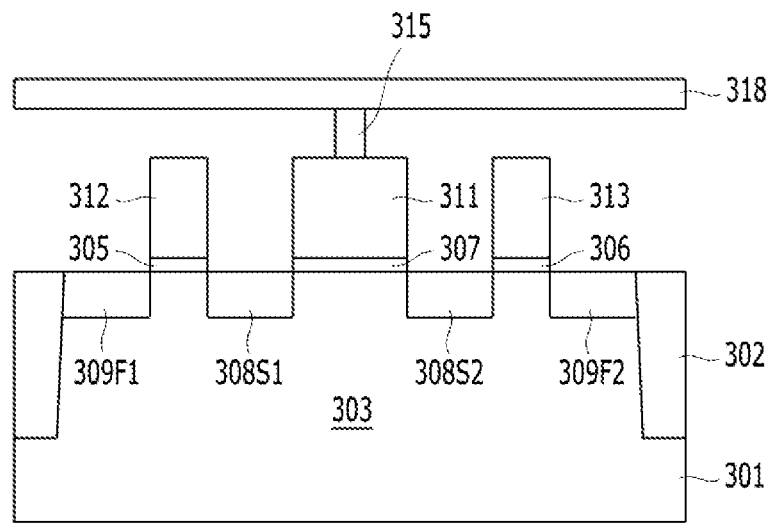
FIG. 11B is a cross-sectional view taken along the line A-A' of FIG. 11A.
Figure 11C:
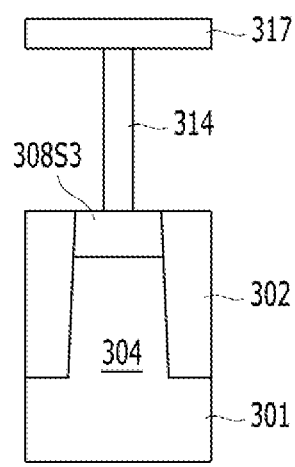
FIG. 11C is a cross-sectional view taken along the line B-B' of FIG. 11A.

FIG. 10 is a circuit diagram of an e-fuse in accordance with a second embodiment. FIG. 11A is a plan view illustrating the e-fuse in accordance with the second embodiment. FIG. 11B is a cross-sectional view taken along the line A-A' of FIG. 11A. FIG. 11C is a cross-sectional view taken along the line B-B' of FIG. 11A.

Referring to FIG. 10, FIG. 11A, FIG. 11B and FIG. 11C, an e-fuse 300 may include a select gate 311, a first program gate 312, and a second program gate 313.

The select gate 311, the first program gate 312, and the second program gate 313 may be formed on a substrate 301, respectively. An isolation region 302 may be formed on the substrate 301, and a first active region 303 and a second active region 304 may be defined by the isolation region 302. The first active region 303 may be an island type. The second active region 304 may be a shape extending in one direction from the center portion of the first active region 303. That is, the first active region 303 may be electrically coupled to the second active region 304. The isolation region 302 may be a shallow trench isolation (STI) region which is formed by trench etching. The first program gate 312 and the second program gate 313 may be formed on the active region 303. The select gate 311 may be formed on the active region 303 between the first program gate 312 and the second program gate 313. The first program gate 312 and the second program gate 313 may be formed across the active region 303. The select gate 311 may cover the center portion of the first active region 303, and one end of the select gate 311 may be extended to cover a part of the second active region 304. The select gate 311, the first program gate 312, and the second program gate 313 may be parallel to one another. The first program gate 312, the second program gate 313 and the select gate 311 may include a conductive material. For example, the first program gate 312, the second program gate 313 and the select gate 311 may include one or more of polysilicon, a metal and a combination thereof.

A first dielectric layer 305 may be formed between the first active region 303 and the first program gate 312. A second dielectric layer 306 may be formed between the first active region 303 and the second program gate 313. A third dielectric layer 307 may be formed between the first active region 303 and the select gate 311. One end of the third dielectric layer 307 may be extended to cover a part of the second active region 304. The first dielectric layer 305, the second dielectric layer 306 and the third dielectric layer 307 may include one or more of silicon oxide, silicon nitride, silicon oxynitride, a high-k material and a combination thereof, respectively. The first dielectric layer 305 and the second dielectric layer 306 may be formed in a thin thickness so as to facilitate the rupture. The third dielectric layer 307 may be thickly formed so that deterioration of reliability of the select gate 311 may be prevented.

A first sharing doping region 308S1 may be formed in the first active region 303 between the opposite side surfaces of the first program gate 312 and the select gate 311. A second sharing doping region 308S2 may be formed in the first active region 303 between the opposite side surfaces of the second program gate 313 and the select gate 311. A first floating doping region 309F1 may be formed in the first active region 303 under one side surface of the first program gate 312. A second floating doping region 309F2 may be formed in the first active region 303 under the one side surface of the second program gate 313. A third sharing doping region 308S3 may be formed in the second active region 304 under one side surface of the select gate 311. The first, second and third sharing doping regions 308S1, 308S2 and 308S3 may be doped with the same conductive impurity as those of the first and second floating doping regions 309F1 and 309F2. For example, they may be doped with an N-type impurity such as phosphorus (P) or arsenic (As). In another example, the first, second and third sharing doping regions 308S1, 308S2 and 308S3, and the first and second floating doping regions 309F1 and 309F2 may include a low concentration doping part and a high concentration doping part. The low concentration doping part may be referred to as a LDD structure. In order to suppress the occurrence of a GIDL current, the first sharing doping region 308S1 and the second sharing doping region 308S2 may have an impurity concentration lower than that of the third sharing doping region 308S3. Thus, the first sharing doping region 308S1, the second sharing doping region 308S2 and the third sharing doping region 308S3 may be formed in an asymmetric junction structure. As a result, reliability of the select transistor SEL Tr may be improved.

A first contact plug 314 may be formed on the third sharing doping region 308S3. A second contact plug 315 may be formed on the select gate 311. The first contact plug 314 and the second contact plug 315 may be at the same level. A first metal line 317 may be formed on the first contact plug 314. A second metal line 318 may be formed on the second contact plug 315. The first metal line 317 and the second metal line 318 may be at the same level and formed independently of each other. The first floating doping region 309F1 and the fourth doping region 309F2 may float. The first contact plug 314 and the second contact plug 315 may be formed of a metal-containing material. For example, they may be formed of tungsten. The first metal line 317 and the second metal line 318 may be formed of a metal-containing material. For example, they may be formed of one or more of aluminum, tungsten and another metal-containing material. The first metal line 317 and the second metal line 318 may be parallel to each other. That is, the first metal line 317 and the second metal line 318 may extend in the same direction in parallel with each other.

The first program gate 312, the first dielectric layer 305, the first sharing doping region 308S1 and the first floating doping region 309F1 may form a first program transistor PGM Tr1. The second program gate 313, the second dielectric layer 306, the second sharing doping region 308S2 and the second floating doping region 309F2 may form a second program transistor PGM Tr2. The select gate 311, the third dielectric layer 307, the first sharing doping region 308S1 and the second sharing doping region 308S2 may form a select transistor SEL Tr. The first program transistor PGM Tr1, the second program transistor PGM Tr2 and the select transistor SEL Tr may be MOSFETs. For example, the first program transistor PGM Tr1, the second program transistor PGM Tr2 and the select transistor SEL Tr may be N-channel MOSFETs.

As above, the first program transistor PGM Tr1 and the second program transistor PGM Tr2 may share a single select transistors SEL Tr. That is, the select transistor SEL Tr may be shared by the first program transistor PGM Tr1 through the first sharing doping region 308S1, and the select transistor SEL Tr may be shared by the second program transistor PGM Tr2 through the second sharing doping region 308S2.

Referring to FIG. 11A, although a single select gate 311 is shown, the single select gate 311 may serve as each select gate of first, second and third sub select transistors S1, S2 and S3, as shown in FIG. 10. That is, the select gates of the first, second and third sub select transistors S1, S2 and S3 may be merged into the single select gate 311. The second sub select transistor S2 and the third sub select transistor S3 may share the third sharing doping region 308S3. The select gates of the first, second and third sub select transistors S1, S2 and S3 may be connected to the second metal line 318. Thus, the first, second and third sub select transistors S1, S2 and S3 may be simultaneously turned on in response to the operating voltage applied to the second metal line 318. As a result, the first, second and third sub select transistors S1, S2 and S3 may be driven in the same manner as the single select transistor of the first embodiment.

As above, since a single select gate may be shared by the first and second program transistors PGM Tr1 and PGM Tr2, it may not be required to dispose two select gates in order to drive the first and second program transistors PGM Tr1 and PGM Tr2, and thus the total area of the e-fuse 300 may be reduced.

Methods for programming operation and reading operation in accordance with the second embodiment are different from those in accordance with the first embodiment. That is, the e-fuse 300 in accordance with the second embodiment may selectively program or read the first program transistor PGM Tr1 and the second program transistor. This may be referred to the following an operation method of the e-fuse array.

Figure 12:
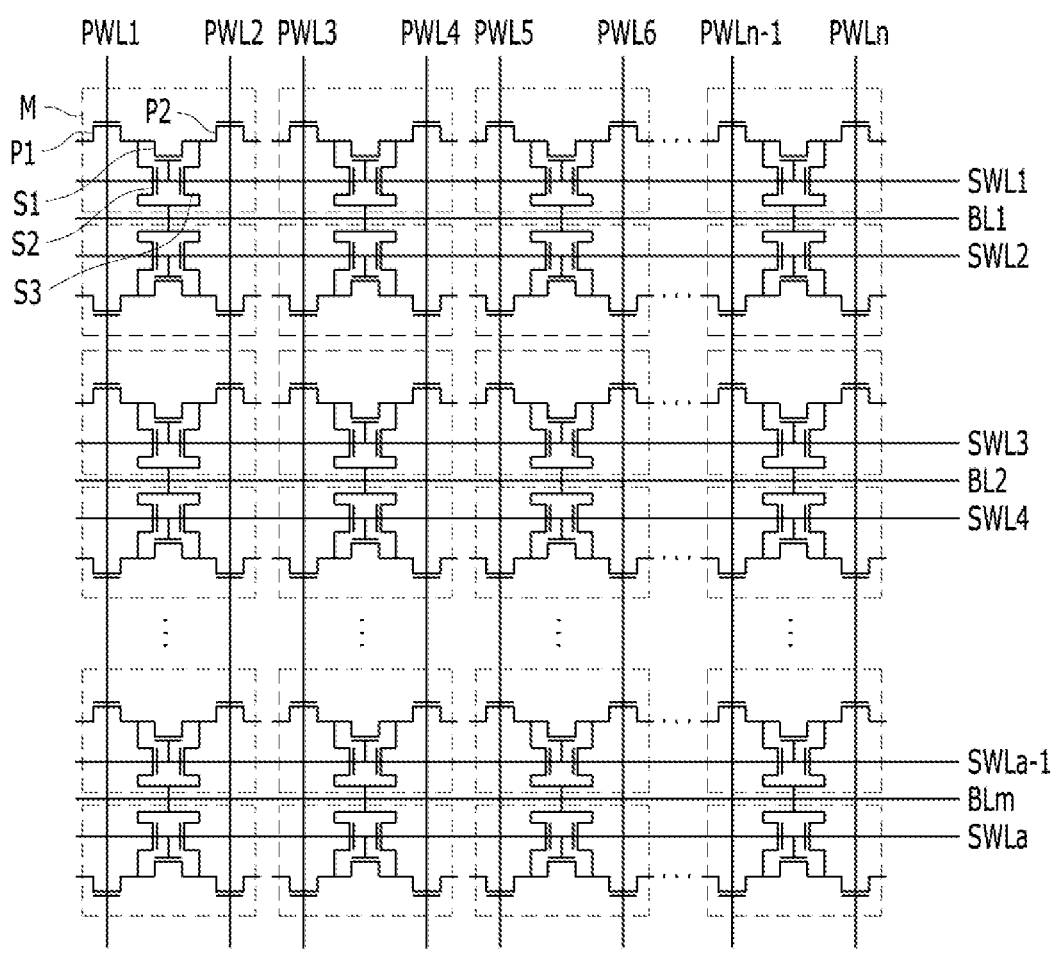
FIG. 12 is a view illustrating an e-fuse array in accordance with the second embodiment.

FIG. 12 is a view illustrating an e-fuse array including the e-fuse in accordance with the second embodiment.

Referring to FIG. 12, an e-fuse array 400 may include a plurality of select word lines SWL1 to SWLa, a plurality of program word lines PWL1 to PWLn, a plurality of bit lines BL1 to BLm and a plurality of e-fuses. The plurality of e-fuses may be arranged in a n×m (n and m are positive integers) matrix type and form an array.

Each of the plurality of e-fuses may include two program transistors and a single select transistor. Each of the e-fuses may have structures described with reference to FIG. 10 and FIG. 11A.

The select word lines SWL1 to SWLa may be positioned on the substrate, and neighboring select word lines may be disposed in parallel with each other. The select word line may extend in the row direction. The select word lines SWL1 to SWLa may be connected to the select gate of the e-fuses, respectively. For example, the select word line may be connected to the select gate 311 described with reference to FIG. 10 and FIG. 11A

The program word lines PWL1 to PWLn may be positioned on the substrate, and neighboring program word lines may be disposed in parallel with each other. The program word line may extend in the column direction. The program word lines PWL1 to PWLn may be connected to the program gate of the e-fuses, respectively. For example, the program word line may be connected to the first program gate 312 or the second program gate 313 described with reference to FIG. 10 and FIG. 11A.

The bit lines BL1 to BLm may be positioned on the substrate, and neighboring bit lines may be disposed in parallel with each other. The bit line may extend in the row direction. The bit lines BL1 to BLm may be connected to any one doping region of each e-fuse. For example, the bit line may be connected to the third sharing doping region 308S3 described with reference to FIG. 10 and FIG. 11A.

Figure 13:
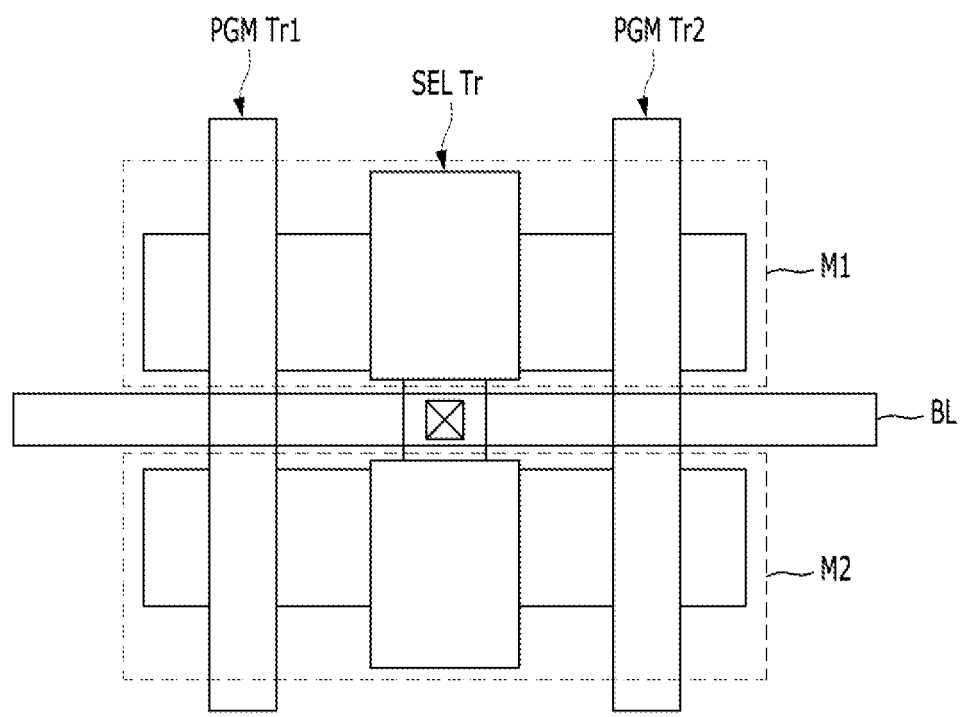
FIG. 13 is a plan view illustrating a part of an e-fuse array of FIG. 12.

FIG. 13 is a plan view illustrating a part of the e-fuse array of FIG. 12.

Referring to FIG. 13, a single bit line BL1 may be shared by neighboring e-fuses M1 and M2.

As shown in FIG. 12 and FIG. 13, since a single select gate of each e-fuse is shared by the two program transistors in the e-fuse array 400, two select gates may not be required so that the total area of the e-fuse array 400 may be reduced. Moreover, since a single bit line is shared by two e-fuses, the total area of the e-fuse array 400 may be further reduced.

Hereinafter, a method for operating the e-fuse array in accordance with the second embodiment will be described. For the sake of convenience, the e-fuse array may be exemplified as a 2×2 e-fuse.

Figure 14:
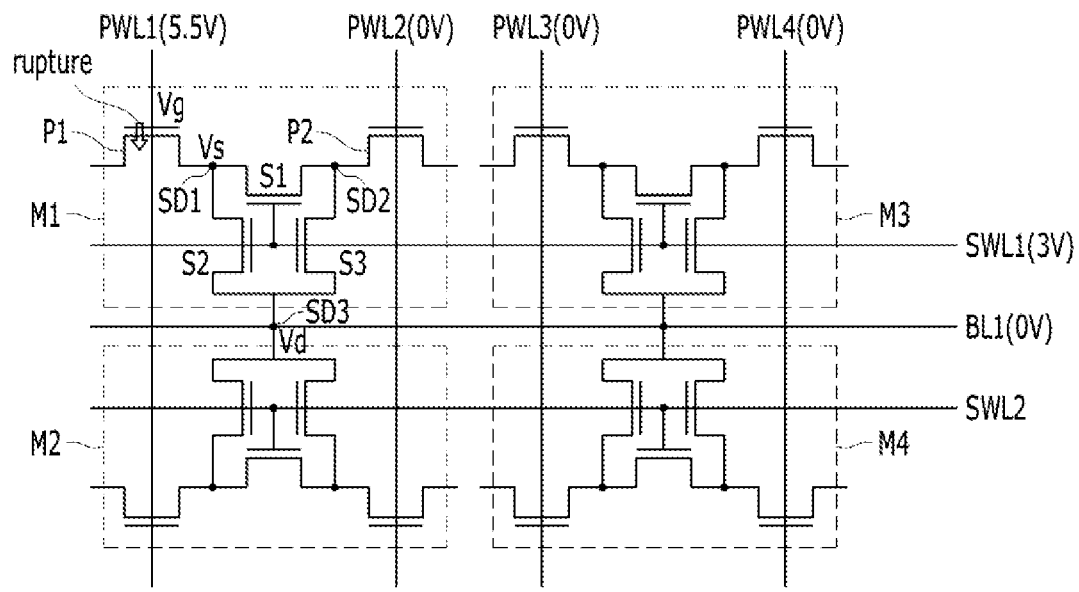
FIG. 14 is a view describing a method for programming an e-fuse array.
Figure 15:
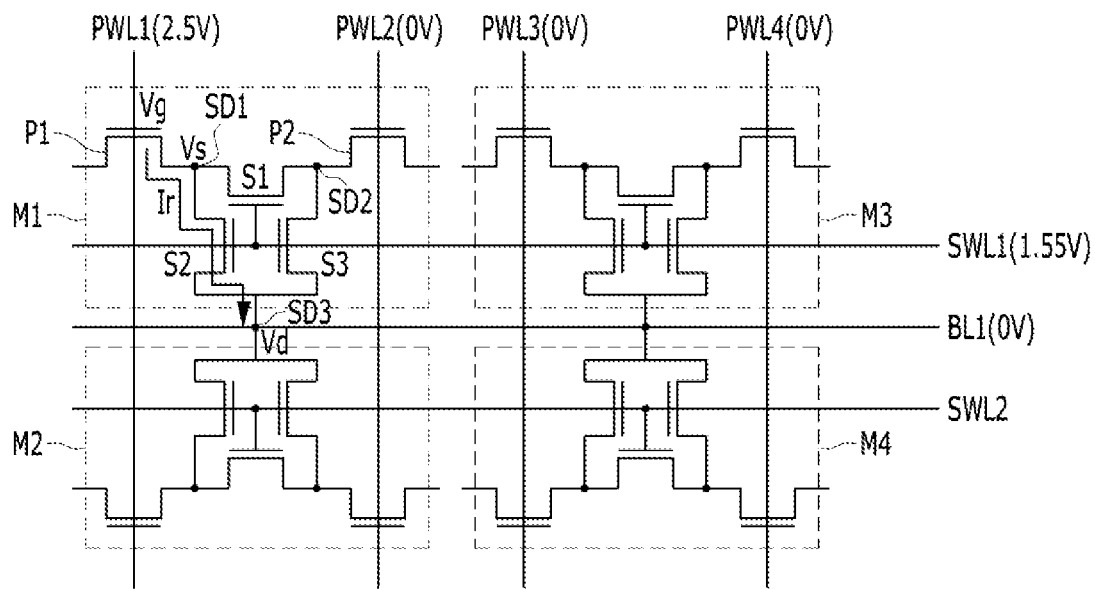
FIG. 15 is a view describing a method for reading an e-fuse array.

FIG. 14 is a view describing a method for programming the e-fuse array, and FIG. 15 is a view describing a method for reading the e-fuse array.

In FIGS. 14 and 15, the e-fuse array may include a plurality of e-fuses M1 to M4, a plurality of select word lines SWL1 to SWL2, a plurality of program word lines PWL1 to PWL4 and a bit line BL1.

Each of the e-fuses M1-M4 may have the structures described with reference to FIG. 10 and FIG. 11A.

A method for operating the e-fuse array may include a method for programming and a method for reading. Hereinafter, the method for operating the e-fuse will be described with respect to, for example, an e-fuse M1.

Programming Operation

Referring to Table 1 and FIG. 14, a plurality of programming voltages may be applied in order to perform the programming operation to the e-fuse M1. For example, the voltage Vp1 may be applied to the select word line SWL1 in order to select the e-fuse M1. The voltage Vp1 may be sufficient to turn on the channel of the sub select transistors S1, S2 and S3. The voltage Vp2 may be applied to the bit line BL1, and the voltage Vp3 may be applied to the program word line PWL1. The voltage difference between the voltage Vp2 and the voltage Vp3 may be sufficient to rupture the gate dielectric layer of the program transistor P1 of the selected e-fuse M1.

During the programming operation to the selected e-fuse M1, the voltage Vp1 applied to the select word line SWL1 may turn on the channels of the sub select transistors S1, S2 and S3. Therefore, the voltage Vp2 applied to bit line BL1 may reach the channel of the program transistor P1 through the sub select transistors S1, S2 and S3 and the first sharing doping region SD1. Here, the voltage difference between the Vp3 applied to the program word line PWL1 and the Vp2 applied to the bit line BL1 may rupture the gate dielectric layer of the program transistor P1. Thus, the selected e-fuse M1 may be programmed.

For example, the voltage Vp1 applied to the select word line SWL1 may be 3V, the voltage Vp2 applied to the bit line B1 may be 0V, and the voltage Vp3 applied to the program word line PWL1 may be 5.5V. The program word line PWL2 may have a voltage of 0V or may float.

Since the voltage Vp3 is applied to the program word line PWL1 and the program word line PWL2 floats, the gate dielectric layer of the program transistor P1 of the selected e-fuse M1 may be selectively ruptured.

During the programming operation to the selected e-fuse M1, as the e-fuse M1, the unselected e-fuse M2 may be shared by the bit line BL1 and the program word line PWL1. The voltage Vp2 may be applied to the bit line BL1 connected to the unselected e-fuse M2. Even in such a case, since the voltage applied to the select word line SWL2 is a grounded voltage (0V), the select transistor of the unselected e-fuse M2 may be in a turn-off state. Therefore, the gate dielectric layers of the program transistors of the unselected e-fuse M2 may not be ruptured. That is, the unselected e-fuse M2 may not be programmed.

During the programming operation to the selected e-fuse M1, the unselected e-fuses M3 and M4 may also be shared by the select word line SWL1 and the bit line BL1. However, since the voltages applied to the program word lines PWL3 and PWL4 are grounded voltages (0V), the gate dielectric layers of the program transistors of the unselected e-fuse M3 may not be ruptured. That is, the unselected e-fuse M3 may not be programmed. Moreover, since the voltage applied to the select word line SWL2 is a grounded voltage (0V), the select transistor of the unselected e-fuse M4 may be in a turn-off state. Therefore, the gate dielectric layers of the program transistors of the unselected e-fuse M4 may not be ruptured. That is, the unselected e-fuse M4 may not be programmed.

Reading Operation

Referring Table 2 and FIG. 15, the reading operation will be described.

A plurality of reading voltages may be applied in order to perform the reading operation to the e-fuse M1. For example, the voltage Vr1 may be applied to the select word line SWL1 connected to the e-fuse M1 in order to select the e-fuse M1. The voltage Vr2 may be applied to the program word line PWL1 connected to the e-fuse M1, the voltage of 0V may be applied to the bit line BL1 connected to the e-fuse M1. The voltage Vr1 may be sufficient to turn on the channels of the sub select transistors S1, S2 and S3. The information stored in the e-fuse M1 may be determined by detecting an electrical current Ir flowing to the bit line BL1 through the channels of the sub select transistors S1, S2 and S3 and the third sharing doping regions SD1 and SD3.

For example, the voltage Vr2 may be 2.5V, and the voltage Vr1 may be 1.55V. When the first program transistor PGM Tr1 is ruptured, the voltage of 2.5V may be applied to the bit line BL1 since the gate of the first program transistor PGM Tr1, the sharing doping regions and the drain of the select transistor are shorted.

Figure 16:
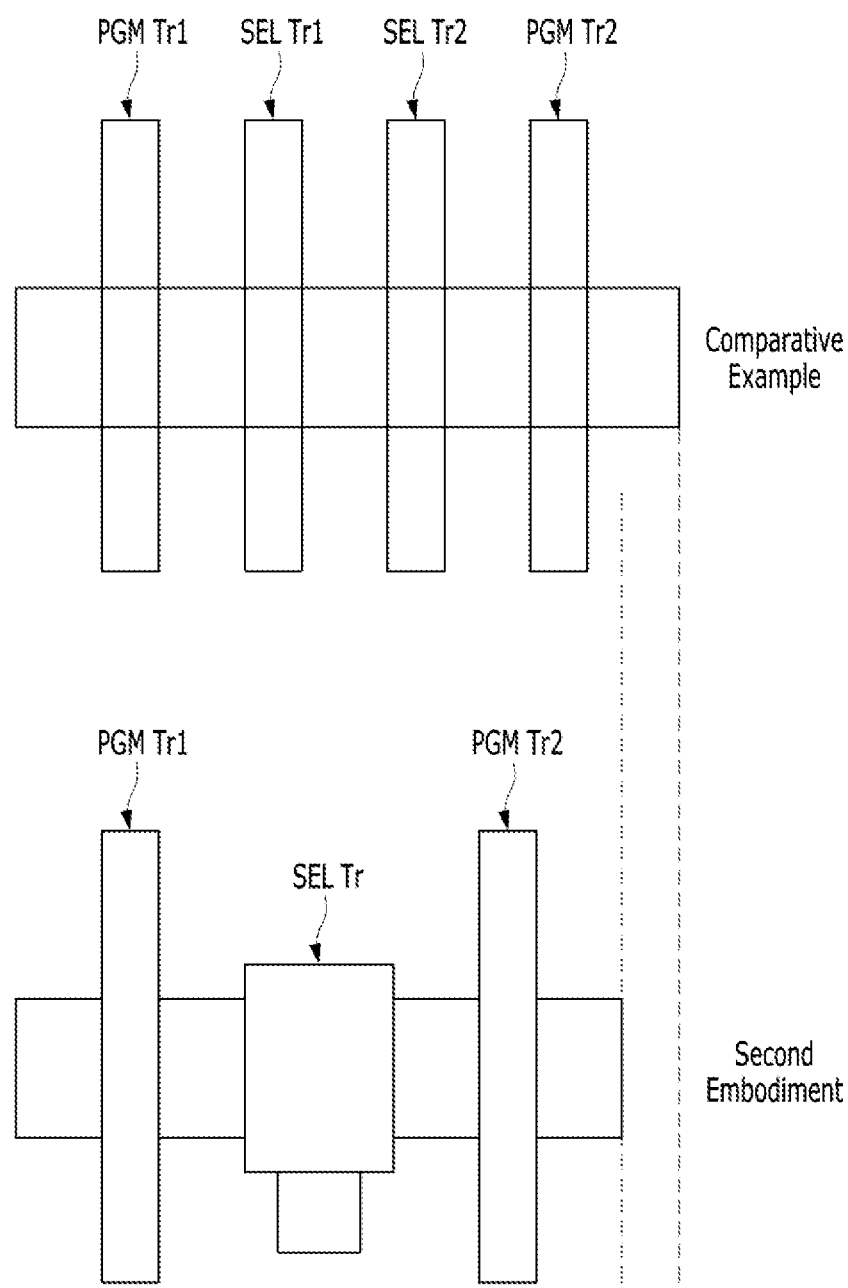
FIG. 16 is a view describing area reduction effect of an e-fuse array in accordance with the second embodiment.

FIG. 16 is a view describing the area reduction effect of the e-fuse array in accordance with the second embodiment. As a comparative example, FIG. 16 shows a select transistor provided to select a program transistor.

Referring to FIG. 16, since the only select gate is arranged in the e-fuse array in accordance second embodiment, the total area may be reduced in comparison with the comparative example. For example, it is possible to reduce the area by about 10%.

According to the embodiments, since two program transistors share a single select transistor, the areas of an e-fuse and an e-fuse array may be reduced.

Also, according to the embodiments, since a program transistor is isolated by a select transistor through an isolation region, the stress applied to the select transistor may be alleviated to realize the reliable e-fuse and e-fuse array.

Further, according to the embodiments, since two program transistors share a single select gate and two neighboring e-fuses share a single bit line, the area of the e-fuse array may be reduced.

While the present invention has been described with respect to the specific embodiments, it will be apparent to those skilled in the art that various changes and modifications may be made without departing from the spirit and scope of the invention as defined in the following claims.

What is claimed is:

1. An e-fuse comprising:
   a substrate including a first active region and a second active region that are spaced from each other by an isolation region;
   a first program gate and a second program gate that are disposed over the first active region in parallel with each other;
   a single select gate disposed over the second active region;
   a sharing doping region formed in the first active region between the first program gate and the second program gate;
   a first doping region and a second doping region that are formed in the second active region on both sides of the select gate;
   a first metal line configured to electrically coupled the sharing doping region to the first doping region;
   a second metal line connected to the second doping region;
   a first dielectric layer between the first active region and the first program gate;
   a second dielectric layer between the first active region and the second program gate; and
   a third dielectric layer between the select gate and the second active region,
   wherein same level of programming voltage is applied to the first program gate and the second program gate, and
   wherein the first dielectric layer and the second dielectric layer are simultaneously ruptured.

2. The e-fuse according to claim 1, wherein the first dielectric layer and the second dielectric layer have the same thickness, and the third dielectric layer is thicker than the first and second dielectric layers.

3. The e-fuse according to claim 1, further comprising:
   a first contact plug provided between the sharing doping region and the first metal line; and
   a second contact plug provided between the first doping region and the first metal line.

4. The e-fuse according to claim 1, wherein the first doping region has an impurity concentration lower than that of the second doping region.

5. The e-fuse according to claim 1, wherein the isolation region is a shallow trench isolation (STI) region.

6. An e-fuse array comprising:
   a plurality of select word lines, a plurality of program word lines, a plurality of bit lines and a plurality of e-fuses,
   wherein each of the plurality of e-fuses comprises:
   a substrate including a first active region and a second active region that are spaced from each other by an isolation region;
   a first program gate and a second program gate that are disposed over the first active region in parallel with each other;
   a single select gate disposed over the second active region;
   a sharing doping region formed in the first active region between the first program gate and the second program gate;
   a first doping region and a second doping region that are formed in the second active region on both sides of the select gate;
   a first metal line configured to electrically coupled the sharing doping region to the first doping region;
   a second metal line connected to the second doping region;
   a first dielectric layer between the first active region and the first program gate;
   a second dielectric layer between the first active region and the second program gate; and
   a third dielectric layer between the select gate and the second active region,
   wherein same level of programming voltage is applied to the first program gate and the second program gate, and
   wherein the first dielectric layer and the second dielectric layer are simultaneously ruptured.

7. The e-fuse array according to claim 6,
   wherein the second doping region is electrically coupled to the bit lines,
   wherein the first and second program gates are electrically coupled to the program word lines, respectively, and
   wherein the select gate is electrically coupled to the select word lines.

8. The e-fuse according to claim 6, wherein the first dielectric layer and the second dielectric layer have the same thickness, and the third dielectric layer is thicker than the first and second dielectric layers.

9. The e-fuse array according to claim 6, further comprising:
   a first contact plug provided between the sharing doping region and the first metal line; and
   a second contact plug provided between the first doping region and the first metal line.

10. The e-fuse array according to claim 6, wherein the first doping region has an impurity concentration lower than that of the second doping region.

11. The e-fuse array according to claim 6, wherein the isolation region is a shallow trench isolation (STI) region.

* * * * *